United States Patent
Boumerzoug et al.

(10) Patent No.: US 6,764,385 B2
(45) Date of Patent: Jul. 20, 2004

(54) METHODS FOR RESIST STRIPPING AND CLEANING SURFACES SUBSTANTIALLY FREE OF CONTAMINANTS

(75) Inventors: Mohamed Boumerzoug, Chandler, AZ (US); Adel George Tannous, Santa Clara, CA (US); Khalid Makhamreh, Los Gatos, CA (US)

(73) Assignee: NanoClean Technologies, Inc., San Jose, CA (US)

( * ) Notice: Subject to any disclaimer, the term of this patent is extended or adjusted under 35 U.S.C. 154(b) by 0 days.

(21) Appl. No.: 10/208,156

(22) Filed: Jul. 29, 2002

(65) Prior Publication Data

US 2004/0018803 A1 Jan. 29, 2004

(51) Int. Cl.$^7$ ................................................. B24C 7/00
(52) U.S. Cl. ............................. 451/39; 451/53; 451/75; 451/89; 134/9
(58) Field of Search .............................. 451/7, 53, 93, 451/75, 37–39, 89, 81; 134/9, 32, 144, 1.1, 7; 438/712; 252/1

(56) References Cited

U.S. PATENT DOCUMENTS

| | | | |
|---|---|---|---|
| 4,793,103 A | * | 12/1988 | Baumgart .................... 451/81 |
| 4,806,171 A | | 2/1989 | Whitlock et al. |
| 5,015,331 A | | 5/1991 | Powell |
| 5,062,898 A | | 11/1991 | McDermott et al. |
| 5,074,083 A | * | 12/1991 | Kanno et al. .................. 451/75 |
| 5,107,764 A | | 4/1992 | Gasparrini |
| 5,108,512 A | | 4/1992 | Goffnett et al. |
| 5,209,028 A | | 5/1993 | McDermott et al. |
| 5,217,925 A | | 6/1993 | Ogawa et al. |
| 5,315,793 A | | 5/1994 | Peterson et al. |
| 5,354,384 A | | 10/1994 | Sneed et al. |
| 5,364,472 A | | 11/1994 | Heyns et al. |
| 5,380,401 A | * | 1/1995 | Jones et al. .................. 438/712 |
| 5,417,768 A | | 5/1995 | Smith, Jr. et al. |
| 5,456,629 A | | 10/1995 | Bingham |
| 5,482,564 A | | 1/1996 | Douglas et al. |
| 5,514,024 A | | 5/1996 | Goenka |
| 5,564,159 A | | 10/1996 | Treiber |
| 5,571,335 A | | 11/1996 | Lloyd |
| 5,616,067 A | | 4/1997 | Goenka |

(List continued on next page.)

OTHER PUBLICATIONS

High Pressure Cleaning System for Disks, IBM Technical Disclosure Bulletin, Jan., 1983.

*Primary Examiner*—George Nguyen
(74) *Attorney, Agent, or Firm*—Loudermilk & Associates

(57) ABSTRACT

A plasma assisted cryogenic cleaner for and a method of performing cleaning of a surface that must be substantially free of contaminants has a resiliently mounted nozzle for spraying a cryogenic cleaning medium on the surface. The cleaning is conducted by applying to the substrate surface a mixture of gases selected from the group consisting of oxygen, nitrogen, hydrogen, fluorine, hydrofluorocarbon or a mixture of such gases to both remove the photoresist layer and alter the composition of the residues such that the residues are soluble in water and/or have a weakened bonds that they can be removed with a stream of cryogenic medium. The cryogenic and plasma processes can be performed sequentially or simultaneously. In certain embodiments, the cryogenic cleaning medium nozzle is driven in an oscillatory or vibratory manner so the nozzle spray is delivered in a manner to provide pulsing of the spray and to provide as "snow plow" effect on contaminants as the spray delivers the cleaning medium against the surface. The surface may be transported past the nozzle, and the cleaning may occur in an enclosed controlled environment.

24 Claims, 10 Drawing Sheets

U.S. PATENT DOCUMENTS

| | | |
|---|---|---|
| 5,632,150 A | 5/1997 | Henzler |
| 5,651,834 A | 7/1997 | Jon et al. |
| 5,669,251 A | 9/1997 | Townsend et al. |
| 5,715,852 A | 2/1998 | Jepsen |
| 5,733,174 A | 3/1998 | Bingham et al. |
| 5,754,580 A | 5/1998 | Kotani et al. |
| 5,765,578 A | 6/1998 | Brandt et al. |
| 5,766,061 A | 6/1998 | Bowers |
| 5,766,368 A | 6/1998 | Bowers |
| 5,775,127 A | 7/1998 | Zito |
| 5,794,854 A | 8/1998 | Yie |
| 5,795,831 A | 8/1998 | Nakayama et al. |
| 5,804,826 A | 9/1998 | Borden et al. |
| 5,806,544 A | 9/1998 | Kosic |
| 5,833,918 A | 11/1998 | Matossian et al. |
| 5,836,809 A | 11/1998 | Kosic |
| 5,837,064 A | 11/1998 | Bowers |
| 5,853,128 A | 12/1998 | Bowen et al. |
| 5,853,962 A | 12/1998 | Bowers |
| 5,858,107 A | 1/1999 | Chao et al. |
| 5,863,170 A | 1/1999 | Boitnott et al. |
| 5,882,489 A | 3/1999 | Bersin et al. |
| 5,908,319 A | 6/1999 | Xu et al. |
| 5,914,278 A | 6/1999 | Boitnott et al. |
| 5,928,434 A | 7/1999 | Goenka |
| 5,931,721 A * | 8/1999 | Rose et al. .................. 451/89 |
| 5,961,732 A | 10/1999 | Patrin et al. |
| 5,989,355 A | 11/1999 | Brandt et al. |
| 6,066,032 A | 5/2000 | Borden et al. |
| 6,099,396 A | 8/2000 | Krone-Schmidt |
| 6,126,524 A | 10/2000 | Shepherd |
| 6,187,684 B1 | 2/2001 | Farber et al. |
| 6,273,790 B1 | 8/2001 | Neese et al. |
| 6,280,585 B1 | 8/2001 | Obinata et al. |
| 6,303,047 B1 * | 10/2001 | Aronowitz et al. ............ 252/1 |
| 6,412,497 B1 * | 7/2002 | Li et al. ...................... 134/1.1 |
| 6,543,462 B1 * | 4/2003 | Lewis et al. ................. 134/144 |
| 6,565,667 B2 * | 5/2003 | Haerle et al. .................. 134/7 |

* cited by examiner

METHODS FOR RESIST STRIPPING AND CLEANING SURFACES SUBSTANTIALLY FREE OF CONTAMINANTS

FIELD OF THE INVENTION

This invention relates to systems and methods for removing photoresist from an integrated circuit structure with a dry process, preferably, in a vacuum stripping chamber, such as photoresist remaining after etch, implant or other fabrication steps. The invented system and method also remove etch residues remaining from the previous fabrication step(s). The present invention also is suitable for cleaning surfaces on hard disks, semiconductor wafers, delicate optics, etc. The present invention more particularly relates to a preferably oscillating nozzle cleaning system, preferably dispensing cryogenic, solvent or solvent combination cleaning mediums, combined with plasma excited reactive gases. The oscillating nozzle cleaning and plasma processes can be performed sequentially or simultaneously.

BACKGROUND OF THE INVENTION

Articles such as hard disks, semiconductor wafers, delicate optics, etc., often must be precisely cleaned in order to remove contaminants, either during or after a process for manufacturing the articles. For example, resist strip and residue clean typically are needed between etch, implant and deposition steps in IC fabrication processes. Conventional dry-type strip/clean sequences typically use plasma to ash resist and wet chemicals to clean residues. Resist stripping is typically carried out using dry plasma ashing. Conventional $O_2$ plasma ashing at high temperature tends to leave polymeric residues that require acids and/or organic solvents for removal. Wet chemistries generally are not desirable due to non-uniformities, selectivity to exposed layers and incomplete resist removal because of mass transport and surface tension associated with the solutions. A variety of alternative cleaning methods have been employed with varying degrees of success. Certain of such methods that have been attempted involve imparting carbon dioxide snow onto the article to be cleaned.

An example of such a conventional carbon dioxide cleaning system is described in U.S. Pat. No. 5,766,061. As a general/summary description of this system, a conveyor transports a wafer-carrying cassette to be cleaned in an enclosure. Jet spray nozzles generate carbon dioxide spray that cleans the wafers. While methods such as described in this patent provide a certain level of cleaning efficacy, improved methods for cleaning a variety of articles are still very much in demand. In addition, conventional jet spray nozzle approaches, while effective in some applications, generally fail in the majority of applications where the bonding between the surface of the wafer and the contamination on the wafer are strong and require chemical reaction, such as plasma, as well as a physical cleaning mechanism for adequate de-contamination and removal of residues, etc.

SUMMARY OF THE INVENTION

The present invention relates to systems and methods preferably using a plasma generation system, as a chemical means, for resist and polymer residue removal and a preferably cryogenic cleaning medium, as a physical means, for enhancing the cleaning of an exposed surface of an article. The cryogenic cleaning medium also helps in reducing submicron defects. The plasma source preferably is either a remote source that provides free-radicals or an ion assisted chemistry activated by direct exposure of the wafer to an RF plasma. In certain preferred embodiments, the free radicals/ions ratio can be controlled by running simultaneously both sources (remote and RF sources). The cryogenic and plasma processes can be performed sequentially or simultaneously in the same chamber or in two separate chambers.

A summary of an exemplary preferred embodiment is as follows. An enclosure is provided for maintaining a controlled environment during the photoresist stripping and post etch, implant or other fabrication step residue cleaning process. The enclosure preferably provides ingress and egress from and to a surrounding environment. A holding chuck preferably is provided that is configured to secure the article to be cleaned of photoresist and/or remaining polymeric residue. The environment preferably is pressure controlled (vacuum) to optimize plasma reaction. A stage or stage means is mounted on the support structure and the holding chuck is mounted on the stage means in a manner so that movement of the article relative to the support structure is provided within the enclosure on a predetermined path between the ingress and the egress points. The stage or stage means, is fixed and the system allows the nozzle to move relative to it for complete surface coverage of the cryogenic gas. A pre-heater, in certain embodiments, is mounted in a first position adjacent the predetermined path in thermal communication with the surface of the article at the first position. Reactive gases such as oxygen preferably are introduced through a remote plasma chamber. The processing chamber is connected to a vacuum exhaust line. A cryogenic spray nozzle assembly preferably is provided wherein a spray nozzle is mounted in the spray nozzle assembly. The spray nozzle is in communication with the cryogenic cleansing medium for providing a cleaning spray at a second position adjacent the predetermined path so that the cleaning spray impinges on the surface to be cleaned at the second position. A post heater optionally is provided and, if so provided, preferably mounted in a third position adjacent to the predetermined path in thermal communication with the surface of the article at the third position. The cryogenic spray nozzle assembly, in preferred embodiments, further includes an assembly or other means for imparting cyclic motion in the spray nozzle so that the cleaning spray is moved bi-directionally relative to the predetermined path. This cyclic motion assembly or means alternatively could be external to the environment.

In another aspect of the present invention, systems and methods are provided for cleaning a surface of an article, wherein a preferred system includes a framework, a holding means that holds the article with the surface exposed, and means for moving the holding means along a predetermined path. The plasma source preferably is separated remotely from the article that is being processed, with free radicals generated remotely. Ion assisted chemistry, optionally or in combination with the remotely generated free radicals, are provided preferably by direct exposure of the wafer to an RF plasma. The plasma also may be activated by both a remote source and an RF plasma source. In preferred embodiments, each form of plasma is independently controlled to cover a wide spectrum of processing conditions in a manner to satisfy the complexity and diversity of these residues. The present invention preferably involves placing the substrate (wafer or other article, etc.) in the plasma reactor, applying to the substrate surface an activated mixture of gases selected from the group consisting of oxygen, nitrogen, hydrogen, fluorine, hydrofluorocarbon or a mixture of such gases to both remove the photoresist layer and alter the composition of the residues such that the residues are soluble in water and/or have a weakened bonds that they can be removed with a stream of cryogenic cleaning medium.

With respect to the cryogenic cleaning assembly, a nozzle having a nozzle axis and a nozzle tip preferably is spaced from and adjacent to the predetermined path for delivering a cleaning spray onto the article surface. Means preferably is mounted between the framework and the nozzle for supporting and driving the nozzle tip through a cyclic motion.

In yet another aspect of the present invention, an oscillating or vibratory nozzle assembly for use in cryogenic cleaning of a surface of an article that must be cleaned substantially free of contaminants is provided, particularly after or as part of a dry process as described herein. An oscillating nozzle assembly in accordance with certain preferred embodiments preferably includes an assembly mounting block, a nozzle mounting block, and means for resiliently connecting the nozzle mounting block to the assembly mounting block. Further, the oscillating nozzle assembly preferably includes an eccentric and a driver connected to the eccentric. In addition, means preferably is provided for mounting the eccentric and the driver between the nozzle mounting block and the assembly mounting block. At least one nozzle preferably is included having a nozzle tip, wherein the nozzle is mounted on the nozzle mounting block so that the driver operates to move the nozzle tip cyclically when the driver is energized. Alternatively, the oscillation can be accomplished by actuators that support the nozzle or nozzle mounting block.

In yet another aspect of the present invention, the oscillating nozzle assembly for dispensing a cleaning medium toward a surface on an article preferably includes a nozzle, a tip on the nozzle for dispensing the cleaning medium, and means for mounting the nozzle. A nozzle assembly base preferably is included together with means for controllably moving the means for mounting the nozzle relative to the nozzle assembly base in a cyclic pattern having a predetermined frequency and amplitude.

Methods in accordance with preferred embodiments of the present invention relate to processing an article having a surface to be cleaned substantially free of contaminates. The process includes the steps of performing a plasma etching/ashing process, preferably to remove a photoresist-type layer, a plurality of pre-cleaning fabrication steps, conducting a cleaning process at a cleaning position using a cleaning spray, and performing a plurality of post-cleaning fabrication steps. The plasma step preferably involves placing the substrate (or other article) in the plasma reactor, applying to the substrate surface an activated mixture of gases selected from the group consisting of oxygen, nitrogen, hydrogen, fluorine, hydrofluorocarbon or a mixture of such gases to both remove the photoresist layer and alter the composition of the residues such that the residues are soluble in water and/or have a weakened bonds that they can be removed with a stream of cryogenic medium.

The step of conducting a cleaning process preferably includes the steps of transporting the surface to be cleaned to the cleaning position together with positioning the surface to be cleaned proximate to the cleaning spray at the cleaning position. Further, the step of oscillating the cleaning spray at the cleaning position in a predetermined pattern preferably is performed to provide improved cleaning in accordance with the present invention.

BRIEF DESCRIPTION OF THE DRAWINGS

The present invention may be more fully understood by a description of certain preferred embodiments in conjunction with the attached drawings in which.

DETAILED DESCRIPTION OF THE PREFERRED EMBODIMENTS

Figure 1:
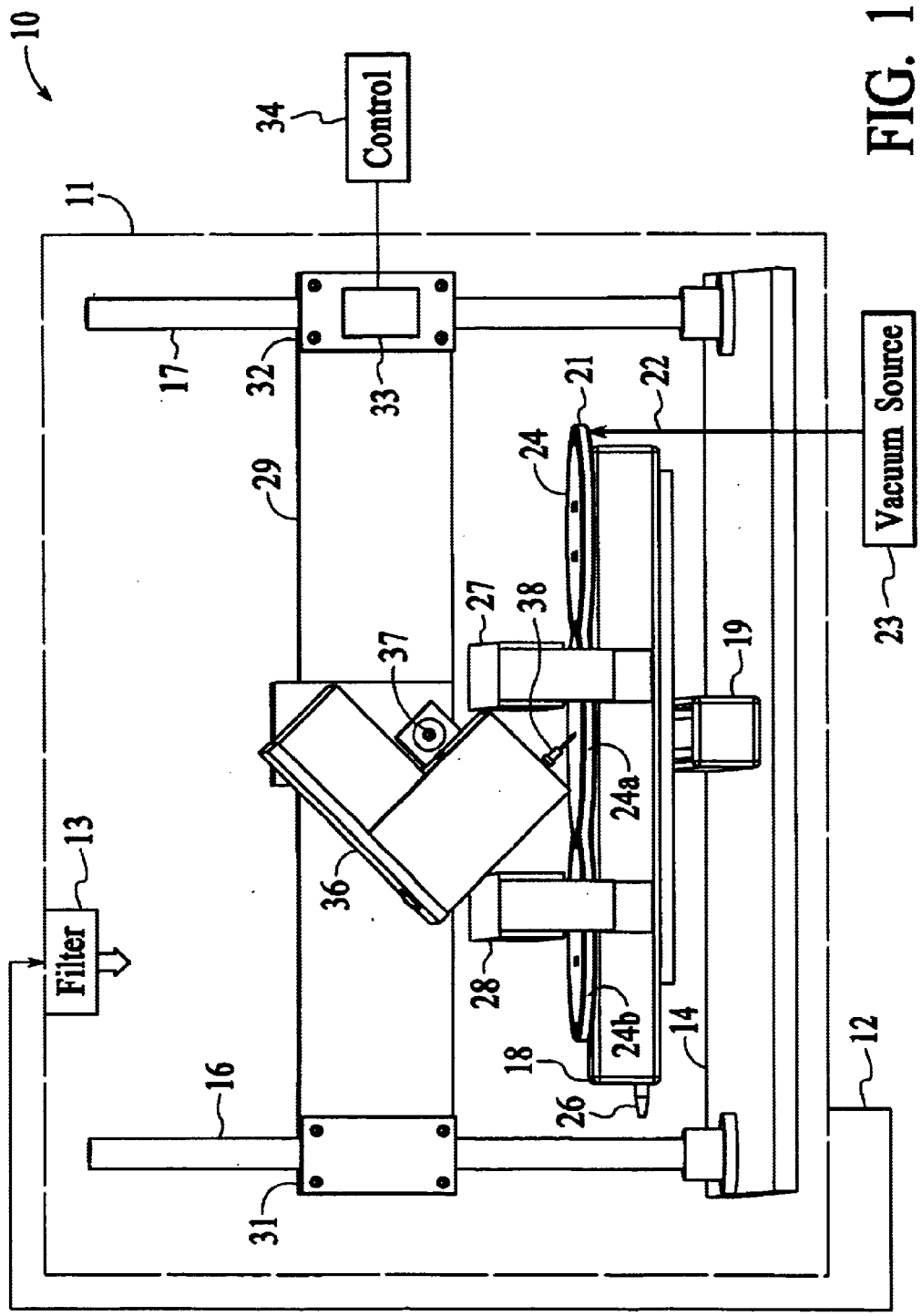
FIG. 1 is a perspective showing one embodiment of the system of the present invention.

The present invention will be described in greater detail with reference to certain preferred embodiments and certain other embodiments, which may serve to further the understanding of preferred embodiments of the present invention. As described elsewhere herein, various refinements and substitutions of the various embodiments are possible based on the principles and teachings herein.

The present invention generally is related to the following pending U.S. patent Applicants assigned to the assignee of the present invention: METHODS FOR CLEANING SURFACES SUBSTANTIALLY FREE OF CONTAMINANTS, application Ser. No. 09/636,265, filed on Aug. 10, 2000, and APPARATUS FOR CLEANING SURFACES SUBSTANTIALLY FREE OF CONTAMINANTS, application Ser. No. 09/637,333, also filed on Aug. 10, 2000 (collectively, "the Referenced Applications"). The Referenced Applications more generally disclosed methods and systems for cryogenically (preferably using carbon dioxide) cleaning articles or surfaces substantially free from contaminants, preferably using an oscillatory nozzle assembly for the cryogenic cleaning medium. As the present invention, in at least certain preferred embodiments, also utilizes an oscillatory or vibratory type nozzle assembly for a cryogenic cleaning medium (preferably in combination with a remotely-generated plasma and/or an RF plasma utilized preferably for removal of a photoresist or similar layer), certain disclosure from the Referenced Application will be set forth herein. The Referenced Applications are hereby incorporated by reference.

The present invention, however, preferably utilizes such an oscillatory or vibratory cryogenic cleaning assembly in combination with a plasma process; in alternative embodiments, the cryogenic cleaning implement is provided in combination with the plasma process, where the oscillatory or vibratory aspect of the cryogenic cleaning assembly is optionally provided (i.e., in such embodiments, the cryogenic cleaning medium may or may not be provided with oscillatory or vibratory action, etc.).

Very small quantities of contamination generally are detrimental to the fabrication processes involved in producing integrated circuit wafers, hard discs, optical elements, etc. Contamination in the form of particulates, films, or microscopic clusters of molecules can produce fatal defects in any of the aforementioned products before, during or after fabrication processes. Cleanliness with elevated temperature processes is extremely important due to the typical increase in the reaction rate of impurities with an increase in temperature. At high temperature it is possible for the impurities to diffuse into the silicon or mix with dielectric or conductors to cause unexpected and unwanted electrical or other characteristics. This tends to cause device failure, degraded reliability, and/or operational failure. Cleaning of the surfaces of such products is therefore essential at various phases during fabrication.

The use of plasma chemistry has become very important in the semiconductor manufacturing sector. In photoresist stripping, the plasma used in a dry process typically is performed using free radicals. This process is usually enhanced by a physical means to improve material removal and cleaning efficiency, often using an ion bombardment process. There are many shortcomings of the aforementioned combination, such as the conflict of the relatively high pressure requirement for the effectiveness of the pure chemical stripping and the ion bombardment processes that require low pressure to increase the ions mean free path. Another problem with the ion bombardment process is that charging damage could occur and cause wafer defects.

In accordance with preferred embodiments of the present invention, a plasma process is provided in conjunction with cryogenic cleaning for the physical removal of contamination. In accordance with the present invention, such an approach tends to eliminate the pressure conflict described elsewhere herein and tends to drastically reduce the charging damage problem. Without being bound by theory, this is believed to be due to the pressure upstream of the nozzle not being very critical in the cryogenic expansion. In addition, in accordance with the present invention, the process preferably is regulated for maximum efficiency by controlling the upstream pressure, velocity, temperature, and the frequency and the amplitude of the nozzle vibration or oscillation.

Cryogenic cleaning of surfaces utilizing impingement of solid particles of relatively inert gases such as argon and $CO_2$ are known and the manner in which solid particles of such gases are generated for cleaning purposes need not be described herein. Without being bound by theory, in such cases it is thought that the combination of sublimation of the solid particles as they impinge the surface to be cleaned as well as the impact momentum transfer by the particles provide the vehicle for removing contamination from a surface. It is further recognized that sublimation occurs, and therefore a major portion of the cleaning, only while the surface to be cleaned is at a higher temperature than that of the cryogenic spray. The thermophoresis due to the heated surface also helps to remove the particles from the surface and reduce the chance for re-deposition of the detached particles. As a consequence, pre-heating and post-heating of the surface being cleaned preferably is required within the vicinity of the impinging cleaning spray. In accordance with preferred embodiments of the present invention, preheating and post heating for the cryogenic cleaning are optional. Another important aspect of single chamber processes with the combination of plasma and cryogenic cleaning is the elimination of contamination that in certain situations tends to be deposited on the wafer with cryogenic cleaning alone. Without being bound by theory, the sources of the contaminants are believed the delivery system and impurities that exist in the cryogenic cleaning medium; those impurities are believed to be composed of fluorinated and other hydrocarbons. The fact that the plasma gases are used to clean fluorinated hydrocarbons tend to eliminate this problem. Cleaning by various other solvents and solvent combinations where the levels of residual contaminants following the cleaning process need not be held quite as low, is also envisioned for use in the systems and methods of the present invention.

As previously explained, certain disclosure from the Referenced Applications will now be provided so that an exemplary, preferred oscillatory cryogenic cleaning assembly and method might be understood.

Reference is now made to FIG. 1 of the drawings, wherein one exemplary embodiment of the present invention is illustrated. A system 10 is shown in FIG. 1 having an enclosure 11 depicted in phantom line. The environment within the enclosure is maintained at a level of cleanliness depending on the level of cleanliness to be imposed on articles to be cleaned within the enclosure. A scavenging line 12 is shown exiting the enclosure 11 at the bottom thereof and proceeding to a filter 13 for removing particulates from the enclosure environment that may be generated by the cleaning process or by mechanical components within the enclosure. Rudimentary support structure is shown including a base plate 14 and two uprights 16 and 17 attached at their bases to the base plate. The description herein makes reference to an XYZ coordinate system, wherein the Z direction is substantially vertical and the mutually orthogonal Z and Y axes are substantially horizontal. An XY stage is shown having an X stage 18 for movement on a Y stage 19, that is mounted on the base plate 14 (other X/Y stage configurations are within the scope of the present invention). A holding chuck 21, in this instance a vacuum chuck connected through a line 22 to a vacuum source 23, is mounted for movement on the X stage 18. An article to be cleaned, in this exemplary illustration an integrated circuit wafer 24, is shown in FIG. 1 mounted to the vacuum chuck 21 and held in place by known means (e.g., held in place by the vacuum). FIG. 1 shows the integrated circuit wafer 24 in an initial position, and subsequently in a cleaning position at 24a and a post-heating position at 24b. The integrated circuit wafer 24 preferably is transportable along a predetermined path governed by the movement of the X stage 18 on the Y stage 19 and the movement of the vacuum chuck 21 on the X stage 18. Chuck 21 is driven over the upper surface of the X stage by known means, which may include a carriage portion within the X stage driven by a lead screw and a servo motor (not shown), for example. A cable connection 26 is shown at one end of the X stage for introducing power to energize the aforementioned servo motor. A similar cable connection (not shown) is provided to power the Y stage 19 so that the X stage, mounted on a moveable carriage of the Y stage, may be moved in the Y direction by a lead screw and servo motor similar to that mentioned hereinbefore in conjunction with the X stage.

From the foregoing it is seen that the integrated circuit wafer 24 shown in an initial position in FIG. 1 may be moved to the left in FIG. 1 to pass beneath a pre-heater 27 at a pre-heat position along the aforementioned predetermined path, which preferably pre-heats the integrated circuit wafer prior to cleaning. Further movement of the chuck 21 brings the integrated circuit wafer to a cleaning position indicated in FIG. 1 at 24a. Continuing movement of the chuck along the predetermined path defined by the X and Y stages 18 and 19 delivers the integrated circuit wafer to a post-heat position shown at 24b, wherein post-heating of the integrated circuit wafer preferably is performed by a post-heater 28. The pre and post heaters may be infrared lamps or other heating sources. These heaters preferably impart surface temperatures to the article that enhance cleaning, prevent re-contamination and remove static electricity. In alternative embodiments, the pre and post heaters are supplemented with, or replaced by, a heated vacuum chuck, with the heated vacuum chuck providing heat to the article to be cleaned, etc. The use of such a heated vacuum chuck also may be used in accordance with other embodiments of the present invention as described herein.

A nozzle assembly support plate 29 is shown extending between the two uprights 16 and 17. The support plate preferably is attached at the upright 16 in a Z position by a friction clamp 31. The support plate 29 preferably is mounted on the opposing end to upright 17 in the Z position by an additional friction clamp 32. It should be noted that the position of the mounting plate 29 in the Z direction may be governed by a servo motor 33 and associated mechanism (not shown) similar to that of the X and Y stages, so that the Z position of the support plate 29 is dictated by a control 34, which may controllably raise or lower the support plate 29 either before, during or after cleaning or other processing.

A spray nozzle assembly 36 is shown mounted to the support plate 29 at a pivot 37. A nozzle 38 is shown extending from the spray nozzle assembly 36 at a lower portion thereof at the cleaning position shown by the position of integrated circuit wafer 24a in FIG. 1. A preferred exemplary angle of the nozzle 38 to the surface to be cleaned on the integrated circuit wafer 24 is seen in FIG. 1 to be obtuse to the direction of approach of the integrated circuit wafer. Expressed alternatively, the angle of the nozzle 38, and the subsequent spray emitted therefrom, is acute to the downstream portion of the predetermined path along which the wafer travels on the XY stage. The point to be made here is that the spray emanating from the spray nozzle 38 preferably is set to impinge the surface to be cleaned at an angle to facilitate contaminant removal and to add any velocity of the surface to be cleaned to the spray velocity for purposes of enhancing contaminant removal. That angle of impingement as seen in FIG. 1 preferably is adjustable by moving the spray nozzle assembly 36 rotationally about the pivot 37 and fixing the angle in the adjusted position.

It should also be noted that, in preferred embodiments, one or more jets for cleaning an article, with the oscillatory-type movement of the present invention, such jets, although having a non-uniform spray pattern, may result in a more substantially uniform and improved spray distribution due to the oscillatory-type movement, which preferably enables an article to be more uniformly cleaned in a single pass, etc.

Figure 2:
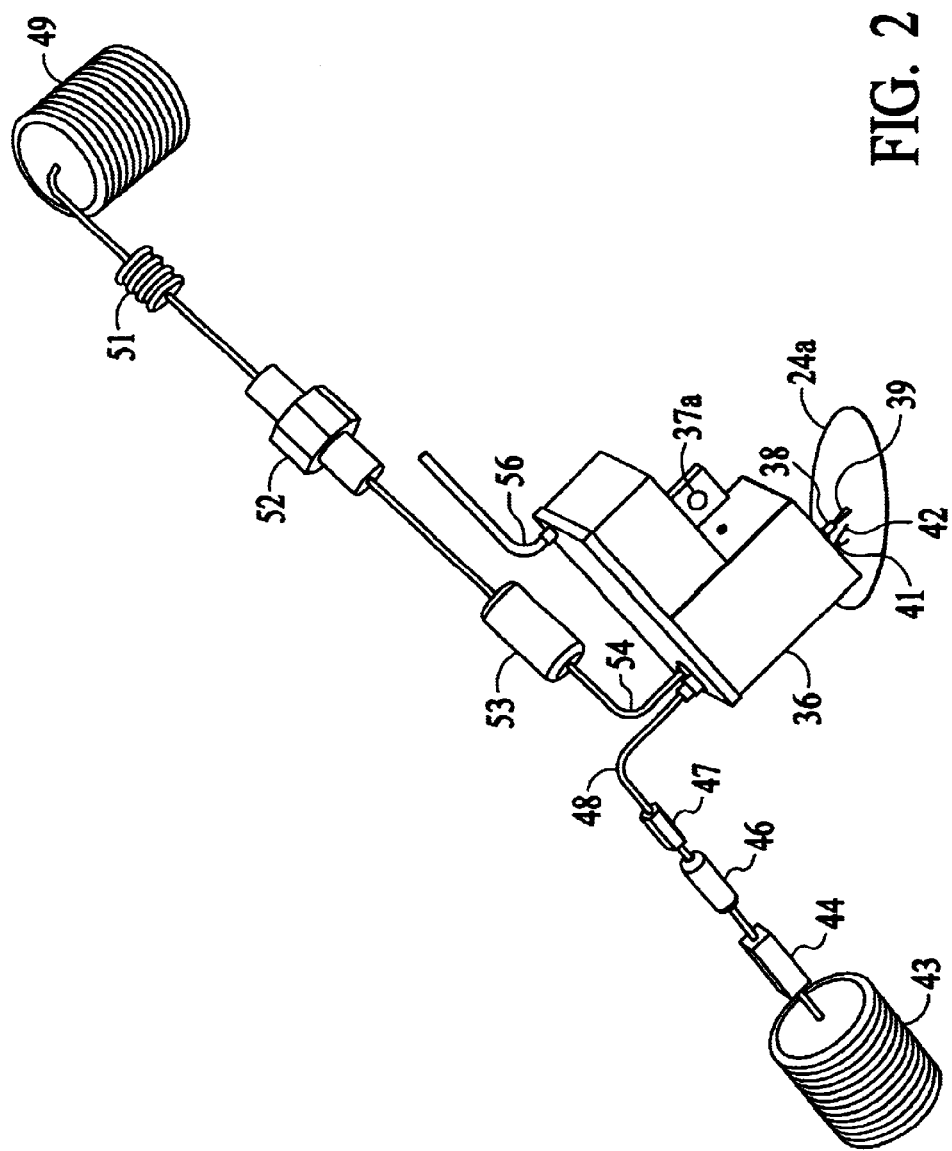
FIG. 2 is a schematic showing gas and vacuum paths for one embodiment of the system of the present invention.

Turning to the diagram of FIG. 2, the spray nozzle assembly 36 is shown poised in position above the integrated circuit wafer in the position represented by 24a wherein the wafer is moving to the left in FIG. 2 relative to the spray nozzle assembly. Nozzle 38 is shown directing a cleaning spray 39 onto the surface of the article to be cleaned (integrated circuit wafer 24a in FIG. 2) at the spray impingement angle referred to hereinbefore in conjunction with FIG. 1. A second spray nozzle 41 is shown just visible in the diagram of FIG. 2 for preferably delivering a heated inert gas spray 42 for heating, drying and removing static electricity from the surface just cleaned by the spray 39. The heated inert gas spray nozzle 41 may fill the requirements of the post-heater 28 shown in FIG. 1. Details of construction of the nozzles 38 and 41 will be described in more detail hereinafter.

FIG. 2 shows an inert gas source 43 connected through a flow line to a temperature control module 44 and subsequently to a gas filter 46. Inert gas flow is subsequently directed through an ionizer 47 and a flexible line 48 to the nozzle 41 contained in the spray nozzle assembly 36. A cleaning medium container 49 (such as an argon or $CO_2$ gas container) preferably is connected through a gas flow line to a temperature control 51. The temperature controlled cleaning medium preferably is connected to a pressure booster 52 and subsequently to a filter 53 for removing contaminants. The filtered, temperature controlled and pressurized cleaning medium preferably is connected through a flexible line 54 to the nozzle 38 in the spray nozzle assembly 36. The manner in which a gas cleaning medium is conditioned for cryogenic cleaning is known, and teachings from the art submitted contemporaneously herewith are incorporated herein by reference. In certain applications the cleaning medium contained in the container 49 may be a solvent different from the cryogenic gas, known to those in this art, descriptions of which will not be undertaken here. A flexible vacuum line 56 is shown in FIG. 2 to remove contaminants generated by functions taking place within the case of the spray nozzle assembly 36 so that they are not deposited upon the surface to be cleaned. The flexible vacuum line 56 is led to the outside of the enclosure 11 when the system containing the spray nozzle assembly 36 is enclosed therein. The location of the pivot 37 of FIG. 1 is shown by the hole 37a depicted in FIG. 2.

Figure 3:
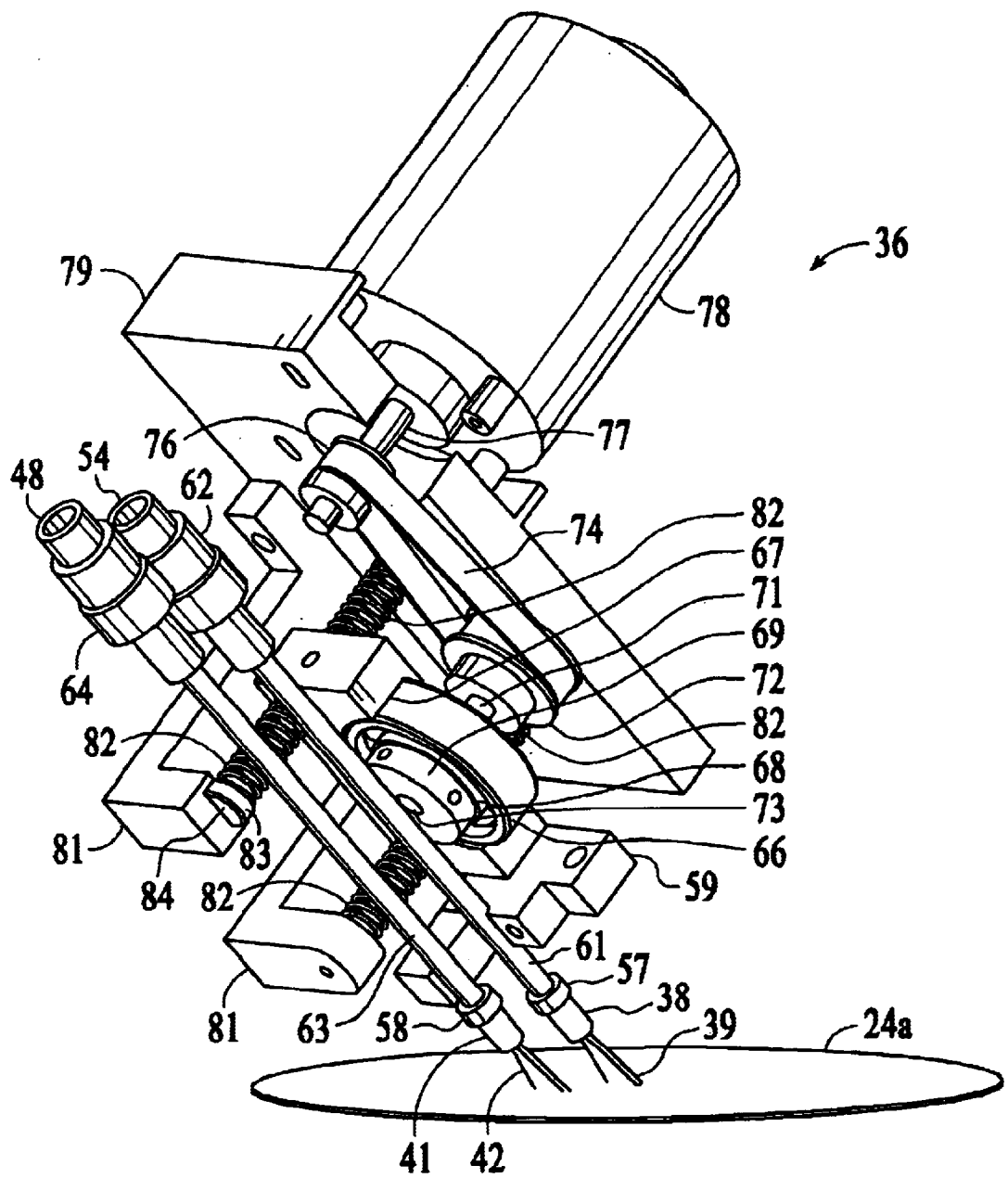
FIG. 3 is a perspective of one embodiment of the spray nozzle assembly of the present invention with the outer cover removed.

FIG. 3 depicts the spray nozzle assembly 36 with the cover removed. The article to be cleaned represented by the integrated circuit wafer 24a is seen to be moving to the left in FIG. 3 relative to the spray nozzle assembly. The spray nozzle assembly is pivoted about the pivot 37 (FIG. 1) to assume the position shown in FIG. 3 so that the cleaning nozzle 38 dispenses the cleaning spray 39 at an obtuse angle relative to the approaching portion of the surface to be cleaned. The cleaning nozzle 38 preferably has a nozzle axis and a nozzle tip with an elongated nozzle opening therein to provide the exemplary preferred fan-shaped spray 39 seen in FIG. 3. A friction lock 57 is shown on the nozzle 38 which allows the tip of the nozzle to be rotated around the nozzle axis and to be locked in the rotated position. Rotation of the tip of nozzle 38 preferably allows the fan-shaped spray 39 to impinge the surface to be cleaned at an angle of rotation about the nozzle axis. This angle of rotation allows the fan-shaped spray 39 to push contaminates to one side of the surface to be cleaned as to the spray nozzle is oscillated to thereby affect a "snow plow" function. This will be further explained in conjunction with the description of the oscillation of the nozzle 38. In like fashion, nozzle 41 for dispensing inert drying gas, preferably has a friction lock 58 functioning in the same manner as the friction lock 57 on nozzle 38. Nozzle 41 also has a tip with an elongated opening therein for preferably producing a fan shaped emission of inert drying gas 42. Nozzle 38 preferably is attached to a nozzle mounting block 59 through a tube 61 and a connector 62 coupling the nozzle 38 to the flexible line 54 (FIG. 2). Nozzle 41 also preferably has a tube 63 connected thereto which is mounted in the nozzle mounting block 59. A connector 64 connects the tube 63 to the flexible line 48 (FIG. 2) to deliver heated inert gas to the surface to be cleaned immediately after cleaning when that method is used for post-heating of and removal of static charge from the surface being cleaned.

Nozzle mounting block 59 in FIG. 3 is cut away to show installation of the outer diameter of an outer bearing race 66 mounted within a bore 67 in the nozzle mounting block. An inner race 68 on the bearing within the bore 67 has an eccentric cam-member 69 mounted therein. A shaft 71 on a pulley 72 is passed through an offset hole 73 in the eccentric cam and fixed therein. The pulley 72 is driven by a belt 74 which in turn is driven by a pulley 76 mounted on the end of a shaft 77 driven by a motor 78. The motor 78 is mounted in a motor mount block 79 (partly cut away for clarity) secured to the outer case of the spray nozzle assembly 36. The motor mount block 79 also serves to mount the pulley 72 for rotation thereon. A plurality of arms 81, two of which are shown in FIG. 3, are fastened to the motor mounting block 79 extending outwardly therefrom to a position beyond the nozzle mounting block 59. Yieldable structure such as coil springs 82, extend from the ends of the arms 81 to the nozzle mounting block 59 and from the motor mounting block 79 to the opposing side of the nozzle mounting block 59. The ends of the coil springs 82 are encompassed by buttons or caps 83 that are seated in counter bores in the structural members 59, 79 and 81 that receive respective ends of the coil springs 82. The material for the end caps 83 is preferably Delrin AF. Very little particulate is sloughed off of the Delrin AF surfaces when the material is subjected to friction. As a result, the springs 82 are anchored on one end within the bores 84 at the ends of the arms 81 and in the motor mounting block 79 and anchored at an opposing end within bores 84 in the nozzle mounting block 59. Nozzle mounting block 59 is therefore suspended by the springs 82 in position spaced from the remainder of the spray nozzle assembly. Consequently, when the spray nozzles 38 and 41 are mounted on the nozzle mounting block 59, and when the nozzle mounting block is moved, the sprays 39 and 42 are moved relative to the surface to be cleaned on the integrated circuit wafer 24a in FIG. 3. An optimum offset from the geometric center of the offset cam 69 has been found to be about 0.075 inches. As a result an optimum peak to peak amplitude for cam excursion is about 0.150 inches. An optimum cam rotation frequency through the pulleys 76 and 72 has been found to be approximately 27.5 revolutions per second or about 27½ Hertz. Thus, in a preferred embodiment, the optimum amplitude provided by the cam 69 falls within the range of about 0.120 to 0.180 inches peak to peak. The optimum frequency falls within the range of about 25 to 30 Hertz. Other amplitudes and frequencies for optimum cleaning of specific contaminants from surfaces are envisioned as within the scope of the present invention.

Springs 82, in this preferred embodiment, preferably have coils of 0.043 inch diameter stainless steel wire, with one half (½) inch diameter coils and lengths of one and one-half (1½) inches. Such springs generally should provide adequately support the mass of the nozzle mounting block 59 and members attached thereto. It should further be noted that motor 78 could be mounted on motor mounting block 79 to directly drive shaft 71 connected to the eccentric cam 69 in those instances where the rotational output speed of the motor shaft 77 imparts an acceptable frequency to the oscillatory motion induced by the rotation of the eccentric cam 69. In any event, the nozzle mounting block 59 and the nozzles 38 and 41 attached thereto are driven at a predetermined frequency and amplitude, so that the nozzles are driven in a circular pattern having a diameter of the peak to peak oscillation amplitude and a frequency determined by the rotational frequency of the eccentric cam 69. The physical dimensions of springs 82 will depend on the mass of the spray nozzle assembly 36. Therefore, heavier or lighter springs 82 may be used as the spray nozzle assembly assumes greater or lesser mass. It is noted that the preferred structure for imparting the cyclic motion to the nozzles 38 and 41 relative to the surface to be cleaned are exemplary.

Figure 4:
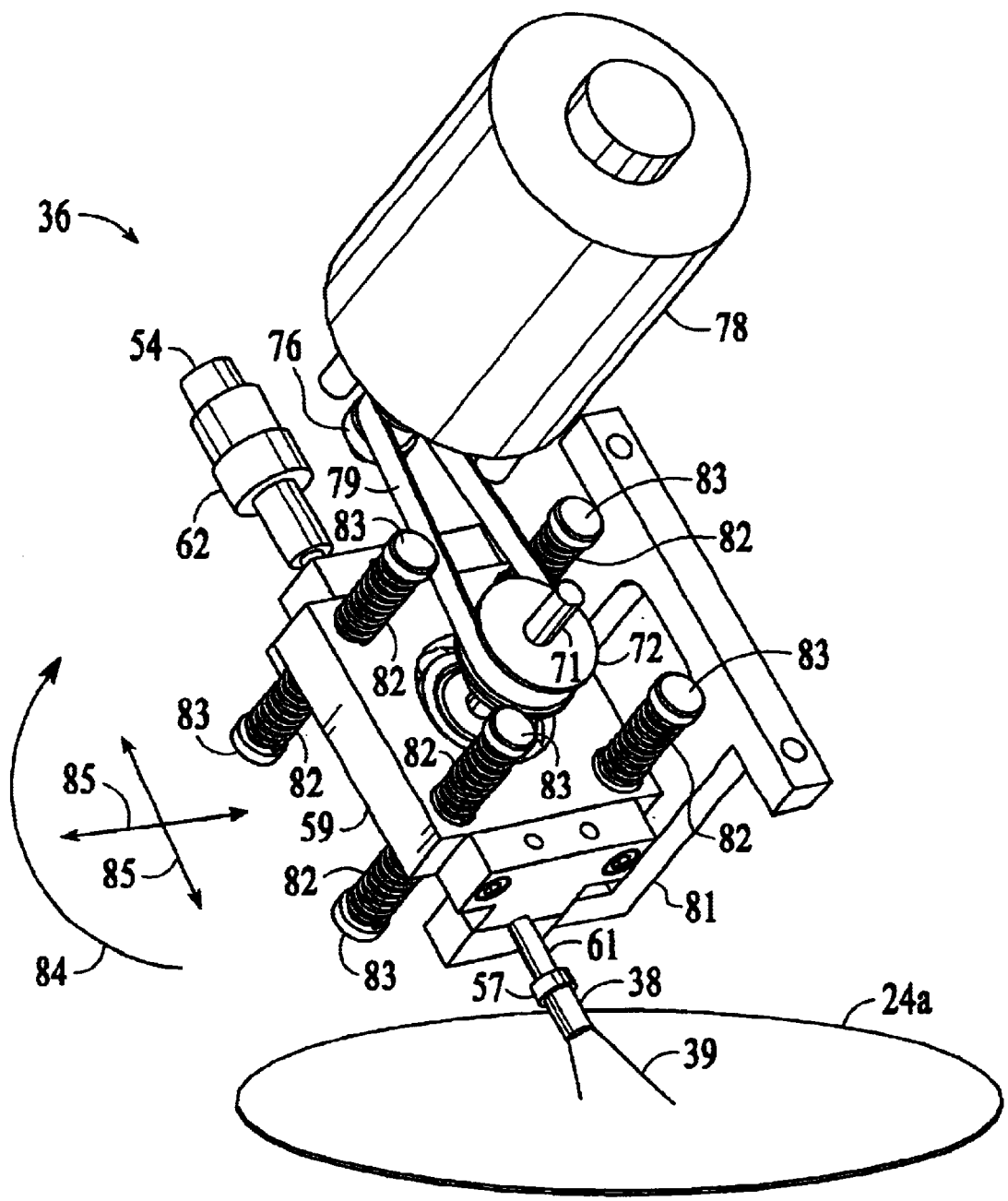
FIG. 4 is a perspective of another embodiment of the nozzle assembly of the present invention with the outer cover removed.

FIG. 4 depicts the spray nozzle assembly 36 with the motor mounting block 79 removed from the drawing for clarity. As seen in FIG. 4, a single nozzle 38 is shown having the aforementioned preferred elongated aperture therein for providing emission of the fan-shaped spray 39 for impingement on the surface to be cleaned. The surface shown in FIG. 4 is the surface of the integrated circuit wafer 24a. Friction lock 57 in the illustration of FIG. 4 is loosened and the nozzle 38 is rotated counter-clockwise (looking at the elongated aperture therein). The orientation of the aperture of nozzle 38 is locked in the adjusted position by the friction lock 57. When the motor 78 is energized and an oscillation in the nozzle 38 is imparted by the oscillation of the nozzle mounting block 59 on the support provided by the springs 82, the nozzle tip, and therefore the spray 39 describes a circular pattern at the predetermined amplitude and frequency. The rotation of the oscillation is indicated by the arrow 84 in FIG. 4.

The impingement of the spray pattern 39 on the surface to be cleaned is illustrated in FIG. 4. The nozzle 38 and the spray pattern 39 moves during half of each rotational cycle toward the integrated circuit wafer. Further, during the subsequent half of each rotational cycle the nozzle and spray move away from the wafer surface. This is seen when it is recognized that the nozzle tip describes a circle during oscillation, wherein the plane of the circle substantially includes an extension of the nozzle axis. This is illustrated in FIG. 4 by the rotational arrow 84 and the arrows 85 representing oscillation circle diameters. The nozzle 38 sweeps the spray 39 side to side on the wafer surface because the edge of the circle represented by diameters 85 appears as a straight line when viewed from the wafer surface.

Now considering the rotation of the flat fan shaped spray 39 about the nozzle axis by the adjustment of the friction lock 57, the fan 39 impinges the surface at a compound angle (displaced from the side to side sweep) preferably resulting in the "snow plow" effect of the fan-shaped spray 39 during half of each cycle as it rotates in the direction of the arrow 84. Further, the disclosed oscillation of the fan-shaped spray 39 provides the benefits of pulsing which enhances cleaning. Pulsing in the past has been provided in a spray by interrupting the spray periodically. However, such interruption causes the spray jet to lose optimum characteristics as the spray is cut off and restarted when the spray is a cryogenic cleaning medium comprised of solid gas particles. The pulsing occurs in the embodiments disclosed herein due to increasing velocity (or acceleration) as the spray 39 converges on the surface to be cleaned during one half (½) of the oscillatory cycle and the decrease in velocity (negative acceleration) as the spray 39 diverges from the surface to be cleaned during the other half of the oscillatory cycle. Spray nozzle 38 describing a circular pattern during oscillation as described hereinbefore, preferably lays down a laterally oscillating spray pattern on the surface to be cleaned. The angle of the spray pattern impingement on the surface is therefore formed by adjustment of the spray nozzle assembly 36 rotationally about the pivot 37 (FIG. 1) and adjustment to the spray fan orientation about the nozzle axis through adjustment of the friction lock 57. Pulsing and compound angle "snow plow" effects in cleaning are believed to provide advantages in obtaining thorough contaminant removal. It should be mentioned that the shaft 71 for driving the eccentric cam 69 (FIG. 3) could be driven directly by the motor 78, allowing elimination of the pulleys 72 and 76 and the belt 74 as discussed in conjunction with FIG. 3. On the other hand, selection of relative diameters of pulleys 72 and 76 may be used to adjust the frequency of oscillation if desired.

Figure 5:
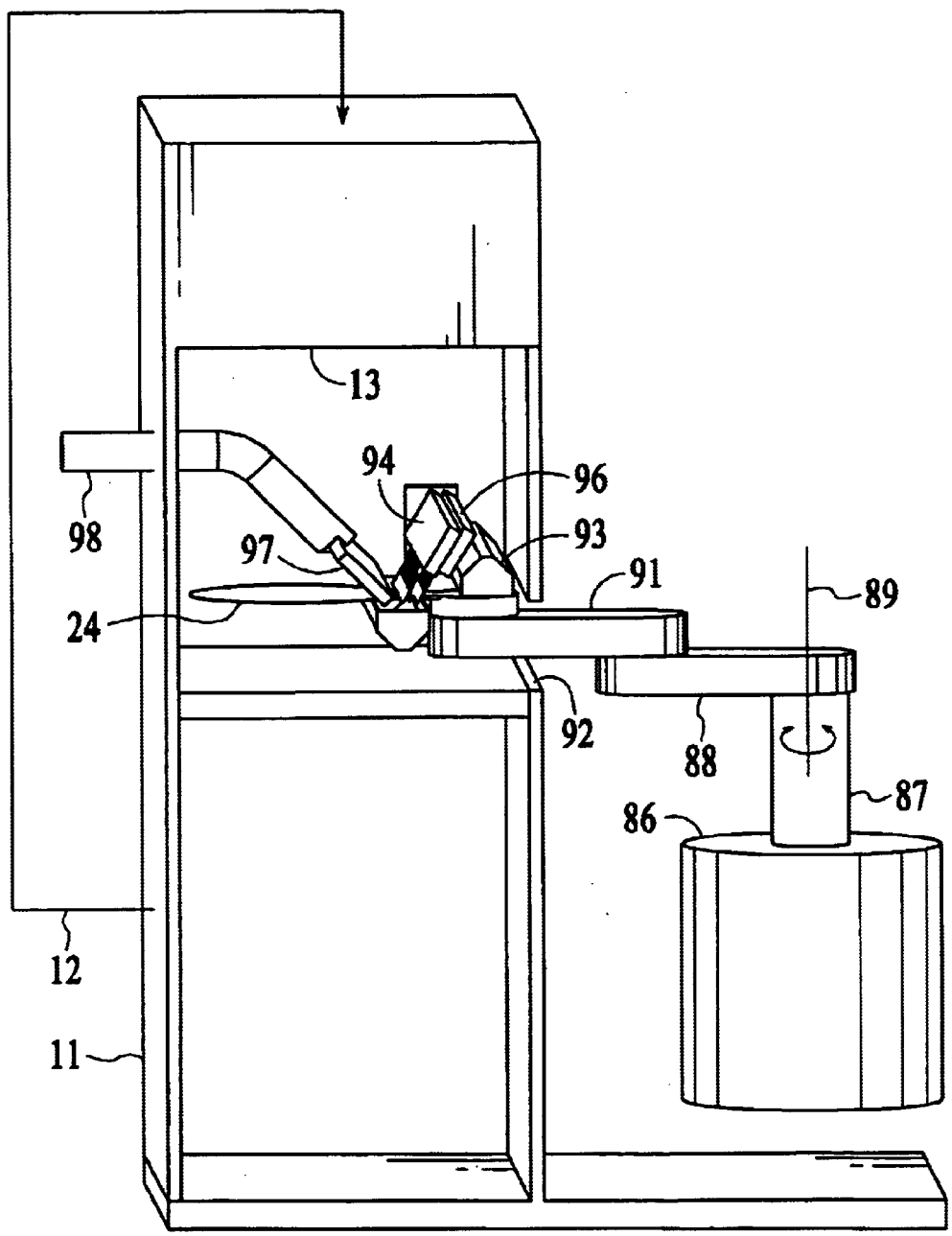
FIG. 5 is a perspective of an additional embodiment of the system of the present invention.

The embodiment of FIG. 5 depicts a robot 86 having an extendable and retractable arm 87, providing movement in a vertical direction, and a laterally extending arm segment 88 disposed for rotation about an axis 89 at the upper end of the arm 87. An additional robot arm 91 is provided that moves translationally in a horizontal direction. Translationally moving arm 91 extends through an egress/ingress port 92 in the enclosure 11 of FIG. 5 to insert an article having a surface to be cleaned, such as the integrated circuit wafer 24, into a controlled environment within the enclosure 11 as discussed in conjunction with the enclosure 11 of FIG. 1. The wafer 24 is shown at the limit of its insertion within the enclosure 11, having passed the pre-heater and post-heater combination 93 immediately inside the ingress/egress port. Wafer 24 is therefore pre-heated at the position shown in FIG. 5 and then withdrawn toward the ingress/egress port 92 to pass beneath a bank (plurality) of cleaning nozzles 94. The bank of nozzles extend across the entire dimension of the wafer, providing impingement by a plurality of fan shaped sprays on the surface to be cleaned, thereby cleaning the surface in a single pass beneath the bank of cleaning nozzles 94. Immediately following passage of the surface to be cleaned beneath the cleaning nozzles 94, an inert drying gas and anti-static electricity array 96 is positioned that also extends across the entire dimension of the wafer 24. As the wafer is withdrawn toward the ingress/egress port 92, the surface is dried by the inert drying gas nozzle array and further heated by the pre/post heater 93 to a temperature that will prohibit condensation on the clean surface as it is withdrawn from the enclosure 11 by the robot arm 91. Positioned adjacent the cleaning nozzle array 94 is a scavenging intake 97 that operates to remove particulates cleaned from the surface of the wafer 94 as well as particulates generated within the enclosure 11. Scavenging intake is connected to an exhaust 98, which carries the contaminants from within the enclosure to the ambient environment. Pressure within the enclosure 11 preferably is maintained slightly higher than ambient pressure to prevent contaminants from entering the enclosure through the ingress/egress port 92. Further, as in the description of the embodiment of FIG. 1, the scavenging line 12 is provided to withdraw the enclosed atmosphere and deliver it to the cleaning filter 13 to further reduce contaminants within the enclosure.

Figures 6, 7:
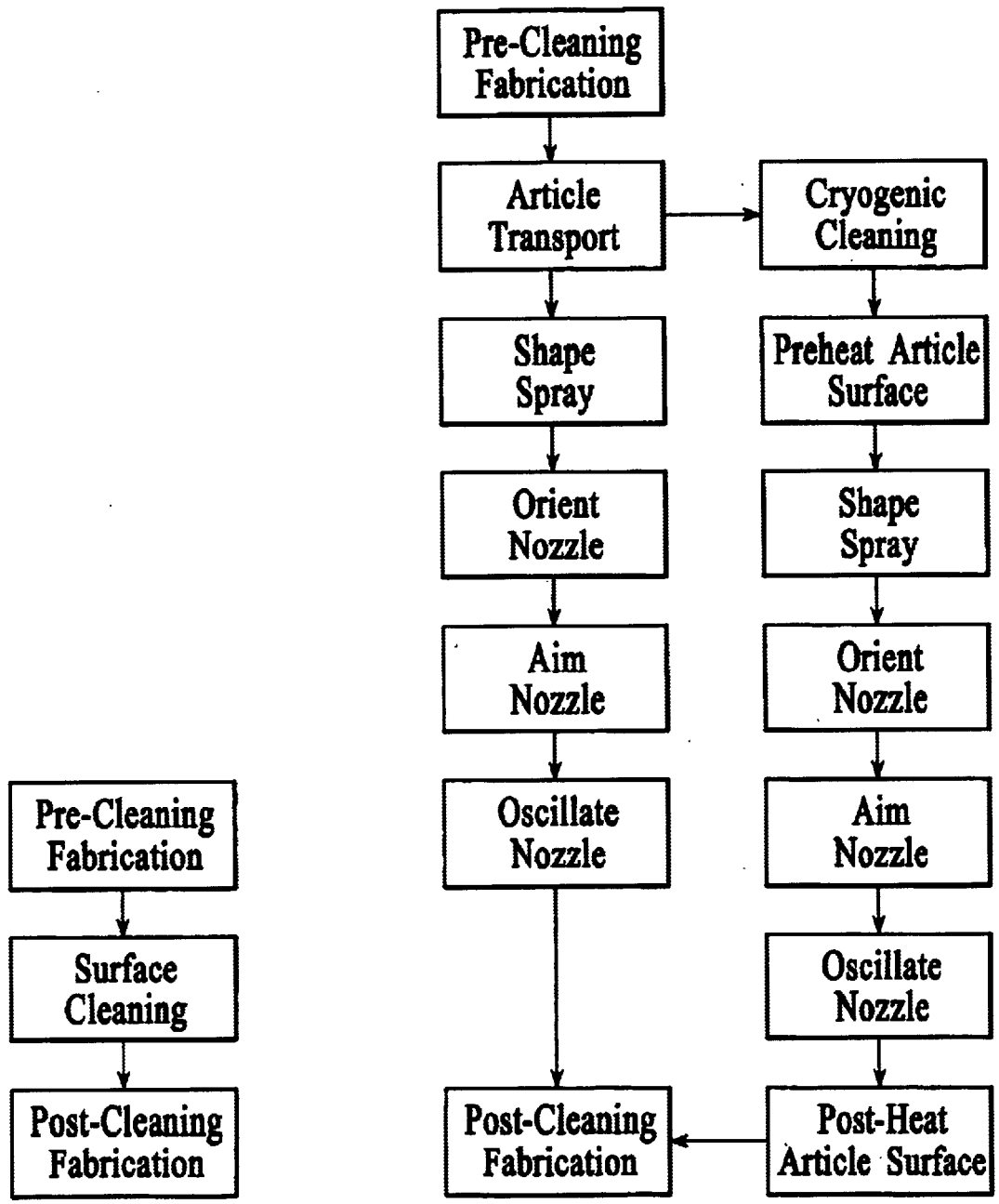
FIG. 6 is a block diagram relating to the process of the present invention.
FIG. 7 is another block diagram illustrating the details of the process of the present invention.

With regard to an exemplary preferred method in accordance with the present invention, there preferably exist certain pre-cleaning fabrication steps for the article having a surface to be cleaned followed by the step of cleaning the surface, and culminating in post-cleaning fabrication steps for the article having a surface to be cleaned. The block diagram of FIG. 6 depicts these steps. Details of a preferred surface cleaning process of FIG. 6 are found in the block diagram of FIG. 7. FIG. 7 illustrates the pre-cleaning fabrication steps of FIG. 6 followed by mounting the article having a surface to be cleaned on an article transport. In one embodiment of the cleaning process the article is transported to a cleaning position and the shape of the spray is configured to assume a fan shape. The spray nozzle in then oriented to cause the spray to impinge the surface to be cleaned at an angle to the lateral dimension of the surface as it passes the spray. This angle is called a compound angle. The nozzle is then aimed at the surface to be cleaned to form an obtuse angle with the surface relative to the approaching portion of the surface to be cleaned. Subsequently, the nozzle is oscillated so that the spray functions as a pulsing spray as the forward motion of the nozzle is added to the velocity of the cleaning spray during one portion of the oscillation cycle and is subtracted from the velocity of the cleaning spray during the subsequent portion of the oscillation cycle. Moreover, the orientation of the nozzle aperture and the fan-shaped spray about the nozzle axis preferably provides a "snow plow" effect facilitating cleaning as previously described. Subsequent to the cleaning by the oscillating fan-shaped spray the article preferably is moved onto the post-cleaning fabrication steps as illustrated in FIG. 7.

In another aspect of the cleaning process of the present invention a cryogenic cleaning medium is used. As mentioned hereinbefore an inert gas such as argon or $CO_2$ is in substantially solid or "snow" form as it is emitted from the nozzle so that sublimation of the gas occurs at the surface to be cleaned. In this process the surface to be cleaned preferably is preheated to a temperature such that the surface to be cleaned will remain at a temperature above ambient during the impingement of the cryogenic spray on the surface. The spray preferably is shaped into a fan shape and the spray nozzle aperture preferably is oriented about the nozzle access to provide impingement of the fan spray on the surface to be cleaned at an angle to the lateral dimension of the surface (the compound angle). The spray nozzle preferably is then aimed at the surface at an obtuse angle relative to the surface portion approaching the cleaning spray and the nozzle preferably is oscillated in a cyclic pattern having a pre-determined amplitude and frequency. The nozzle preferably oscillates in a substantially circular pattern in a plane including the nozzle axis so that the spray pattern is lateral and linear on the surface. Moreover, due to the orientation of the nozzle rotationally about the nozzle axis, the spray impinges the surface at the compound angle and performs a "snow plow" function. This function is believed to tend to push contaminants to one side of the surface to be cleaned. Following exposure to the oscillation cleaning spray, the surface preferably is post-heated to a temperature above ambient temperature to prevent condensation and recontamination of the surface and also to remove static charge. It should be noted that the step of shaping the spray preferably reside in both embodiments of the process described in conjunction with FIG. 7 and includes expanding the width of the cleaning spray to cover the lateral dimension of the surface to be cleaned. As a result, the cleaning of the surface may be obtained in a single pass of the surface to be cleaned past the spray. Subsequently the post-heated article surface is passed to the post-cleaning fabrication steps as seen in FIG. 7.

As previously explained, preferred embodiments of the present invention are directed to the combination of plasma processing (such as removal or ashing of a photoresist-type layer) that provides a chemical mechanism, followed by a cryogenic cleaning processing that preferably provides a physical removal-type mechanism. While oscillatory or vibratory-type cryogenic cleaning is believed to provide more optimum results in certain embodiments, the present invention as set forth herein is expressly not limited to the use of oscillatory or vibratory type cryogenic cleaning, and certain embodiments of the present invention utilize cryogenic cleaning that is not oscillatory or vibratory. Accordingly, the foregoing description from the Referenced Applications is provided as background and for providing a description of an exemplary oscillatory assembly used only in certain embodiments of the present invention.

Figure 8A:
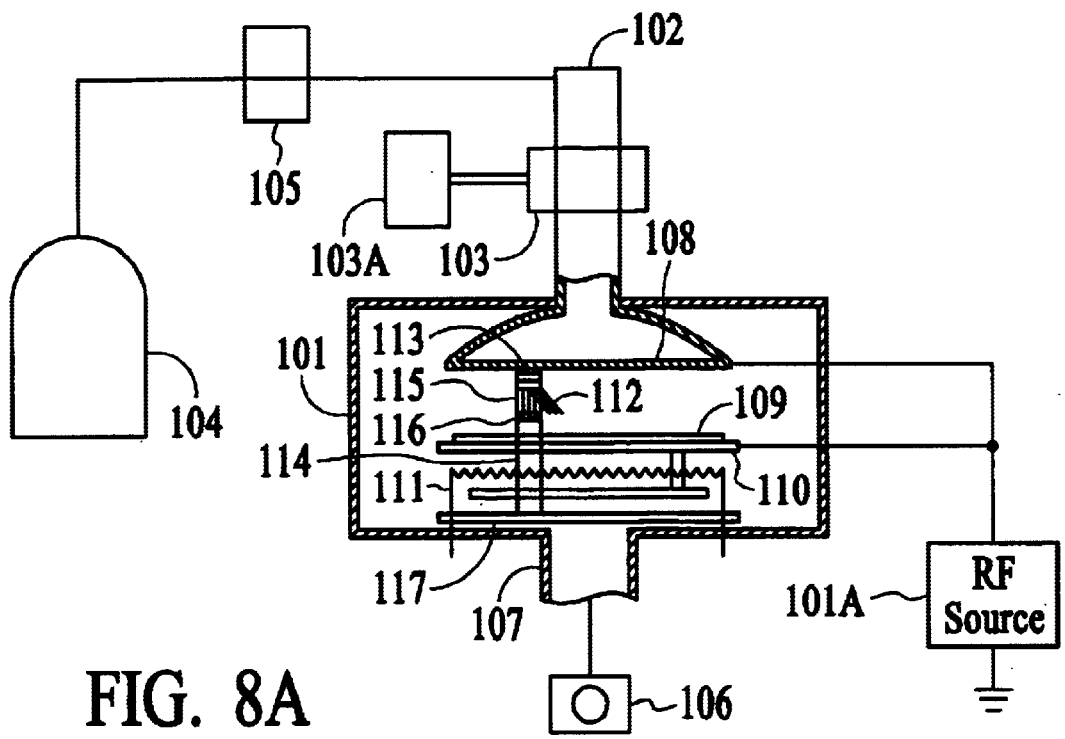
FIGS. 8A and 8B illustrate an assembly for providing remotely generated plasma and/or an RF-generated plasma, with a preferably cryogenic cleaning assembly integrally provided therewith.
Figure 8B:
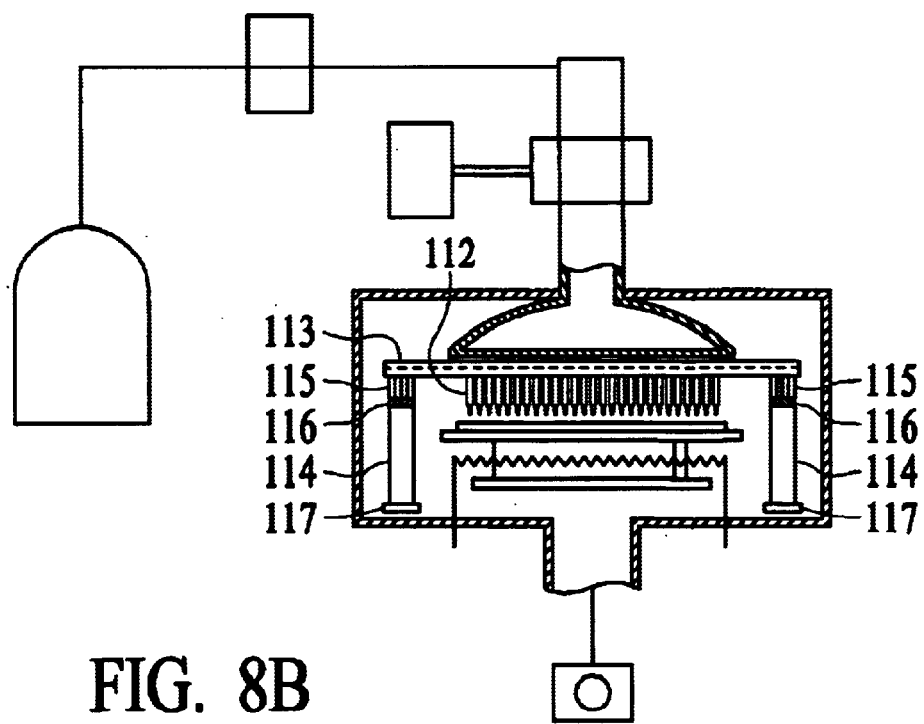

Turning now to FIGS. 8A and 8B, exemplary preferred embodiments of the present invention will now be described.

Referring to FIG. 8A, gas source 104 provides a source of reactant gas, which in preferred embodiments may consist of, for example, gases selected from the group consisting of oxygen, nitrogen, hydrogen, fluorine, hydrofluorocarbon or a mixture of such gases, representative examples being O2, N2, H2, CF4 and NF3, etc. The reactant gas(es) preferably is/are provided through compressed cylinder(s) such as is illustrated by gas source 104 (hereinafter, the reactant gas or gases or referred to simply as the "reactant gas"). In preferred embodiments, the reactant gas is supplied via mass flow controller(s) 105 (which serve to control the flow of the reactant gas) and pipe 102 to plasma applicator 103, which in preferred embodiments consists of a microwave discharge apparatus, which includes or is coupled to microwave source 103A. Microwave source 103A and plasma applicator/microwave discharge 103 create free radicals from the reactant gas, which may then be supplied to vacuum processing chamber 101. The reactant gas free radicals preferably are introduced into processing chamber 101 via a gas distribution system or implement, which in FIG. 8A is illustrated as showerhead 108, such that the activated reactant gas/free radicals are presented to, and may react with, material of the article being processed (indicated as wafer 109 in FIG. 8A, which has been introduced into processing chamber 101 as illustrated).

In preferred embodiments, heated wafer holder 110 is provided over heating implement 111, which optionally provides heat preferably via an electric heating element from the back side of wafer 109, in a manner as is known in the art. As will be appreciated, heating implement 111 may be controlled to provide the proper and optimum temperature for the particular process. Pressure within processing chamber 101 is controlled in part via exhaust pump 106, which is in flow communication with processing chamber 101 via exhaust pipe 107.

It also should be noted that RF source 101A is optionally provided as illustrated. In such embodiments, wafer holder 110 preferably serves as a first electrode, and a second electrode is provided, which may consist of the housing of processing chamber 101 or showerhead 108 as illustrated in FIG. 8A. In accordance with certain embodiments of the present invention, RF source 101A provides RF energy that creates an RF plasma that produces radicals and ions from the reactant gas that are provided to wafer 109, such as for ashing or removing a photoresist-type layer on wafer 109. In certain embodiments, only an RF plasma is utilized (and thus the remote plasma discharge 103 is not provided or operative), while in other embodiments only the radicals produced by remote plasma discharge 103 are utilized (and thus RF source and/or the first and second electrodes are not provided or are not operative), while in yet other embodiments both the RF plasma and the radicals produced by remote plasma discharge 103 are utilized. It should be understood that the RF plasma and electrodes may be biased and controlled such that what is known as an RIE process may be carried out, although the present invention is not limited thereto. What is important is that one or more plasma/free radical sources are provided to deliver the reactant gas species to the surface of wafer 109 such that the photoresist or similar layer thereon may be attacked chemically (which may have a physical component as well, in the case of an RIE process) so as to ash or remove the photoresist layer. An exemplary disclosure of such an apparatus having a microwave discharge implement and an RF/RIE plasma is U.S. Pat. No. 5,795,831, which is hereby incorporated by reference for background purposes.

In conventional approaches, a de-ionized water or solvent process is provided after plasma treatment in order to remove residue resulting from the plasma process. The necessity of such a DI water and/or solvent cleaning has been determined to be detrimental to optimum processing, and in accordance with embodiments of the present invention a cryogenic cleaning process is performed as part of, or subsequent to, the plasma process. As illustrated in FIG. 8A, nozzle/nozzle assembly 112 is provided with a transport mechanism that moves nozzle/nozzle assembly 112 relative to wafer 109 in a manner such that the cryogenic cleaning medium (preferably consisting of or including carbon dioxide) impinges on and over the surface of wafer 109. The use of the cryogenic cleaning process, in combination with the remotely-generated and/or RF generated plasma, has been determined to provide more optimum removal of photoresist-type layers.

In accordance with certain preferred embodiments, an oscillatory or vibratory discharge of the cryogenic cleaning medium is provided in order to provide more optimum cleaning. While the Referenced Applications described exemplary ways of implementing such an oscillatory or vibratory mechanism, the embodiment illustrated in FIG. 8A illustrates another exemplary mechanism. As illustrated in FIG. 8A, an oscillatory/vibratory nozzle cleaning system, preferably dispensing cryogenic, solvent or solvent combination cleaning medium(s) to assist the plasma cleaning and photoresist stripping/removal process. The oscillatory/vibratory nozzle cleaning and plasma processes can be performed sequentially or simultaneously, as will be described in greater detail hereinafter. In the illustrated embodiment, the oscillatory/vibratory nozzle cleaning system includes vibration actuators 115, which are attached to nozzle manifold 113 to induce the oscillation or vibration. The oscillatory/vibrator nozzle cleaning system preferably is mounted on vibration isolators 116 to prevent vibration of posts 114. Posts 114 (preferably two) are mounted on linear slide assembly 117 to allow nozzle/nozzle assembly to "sweep" wafer 109 with the cryogenic cleaning medium. Nozzle manifold 113 preferably utilizes a pressurized plenum to ensure uniform flow through nozzle/nozzle assembly 112. It should be noted that the oscillatory/vibratory nozzle system of FIG. 8A is exemplary; what is important is that the process chamber include plasma treatment capability such as has been described, and also a preferably integral type of cryogenic cleaning medium assembly that can movably or otherwise provide the cryogenic cleaning medium on and over the surface of wafer 109.

In operation, wafer 109 is introduced into processing chamber 101; in an illustrated embodiment, wafer 109 includes a photoresist or similar-type layer that needs to be removed. Plasma/free radicals are generated via the reactant gas (either via plasma applicator/microwave discharge 103 and/or an RF plasma, etc.), which preferably chemically attack and remove the material of the photoresist layer. In the case of reactant gas that is free radicalized via plasma applicator/microwave discharge 103, free radicals and ions are generated from the reactant gas, although it is believed (without being bound by theory) that the concentration of ions that are introduced into processing chamber 101 is low due to the relatively high operating pressure that may be utilized. Either subsequent to or interspersed with plasma processing steps, one or more cryogenic cleaning steps are performed, which serve to remove (preferably with a mechanical type action) residues and contaminants that are present after the plasma/free radical treatment. Without being bound by theory, it also is believed that plasma treatment subsequent to a cryogenic cleaning step helps remove residue that exists after the cryogenic cleaning step, and that the cryogenic cleaning subsequent to a plasma/free radical treatment helps remove residue that exists after the plasma treatment. In combination, it has been determined that such combined processing produces a more optimum photoresist-type layer removal process, which may eliminate or substantially reduce the need for a DI water or solvent rinse process.

FIG. 8B illustrates another view of the embodiment described in connection with FIG. 8A (although for simplicity, for example, RF source 101A has not been shown in FIG. 8B).

FIG. 8B illustrates an embodiment of nozzle/nozzle assembly in flow communication with nozzle manifold 113, and preferably positioned on vibration actuators 115 and vibration isolators 116, which in turn are positioned on posts 114, the assemblage of which is movable via, for example, linear slide assembly 117. Other aspects of FIG. 8B discussed in conjunction with FIG. 8A will not be further discussed.

Figure 11A:
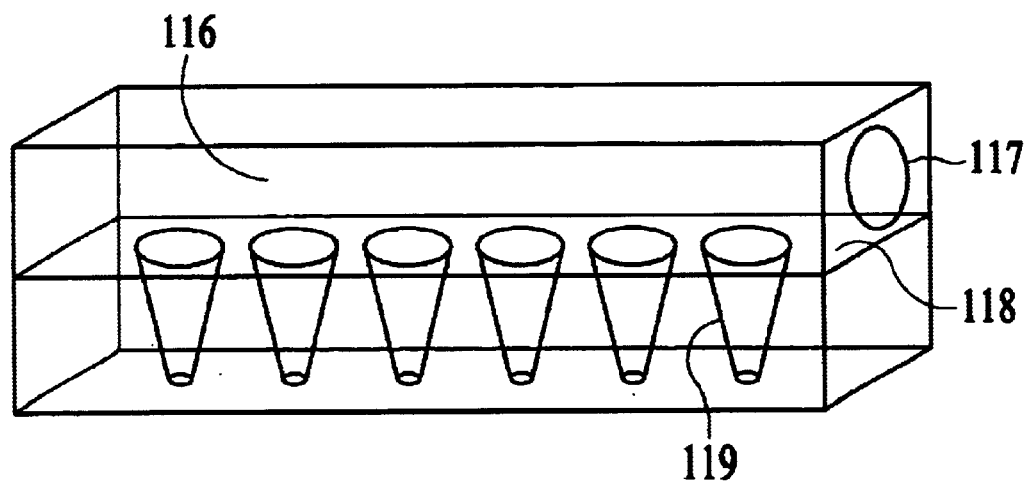
FIGS. 11A and 11B illustrate two alternative nozzle assemblies utilized in certain preferred embodiments.
Figure 11B:
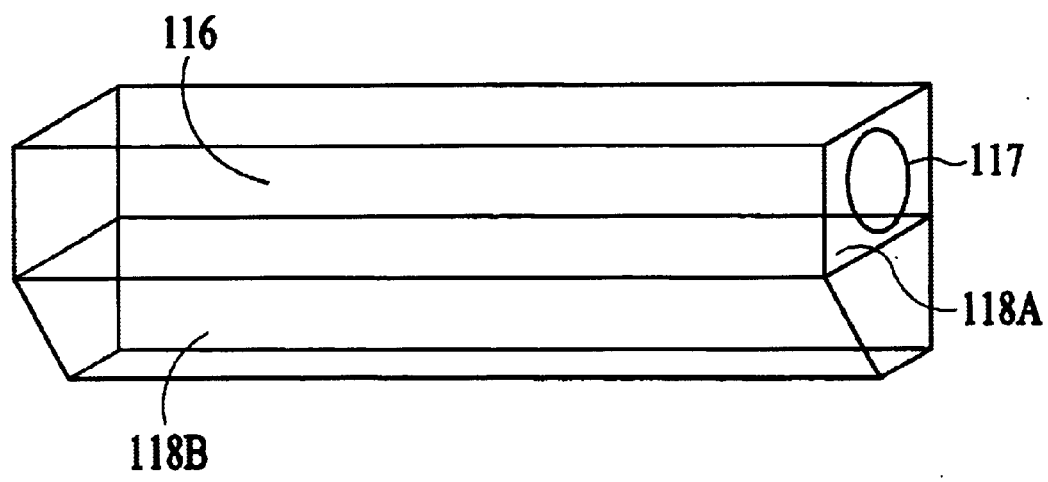

In addition, FIGS. 8A and 8B illustrate a nozzle assembly, another exemplary preferred embodiment of which is illustrated in FIG. 11A. As illustrated in FIG. 11A, cryogenic medium inlet 117 is provided, which is in flow communication with pressure plenum 116. A perforated plate or surface 118 is provided in flow communication with pressure plenum 116, such as is illustrated. As part of, or coupled to, perforated plate or surface 118, but in any event in flow communication therewith, are preferably axi-symmetric nozzles 119. Nozzles 119 may be holes of a tapered or conical shape (or other shape to provide the desired nozzle characteristics) formed in a relatively thick plate (thick enough to accommodate the desired nozzle shape and provide the necessary mechanical strength, etc.). Alternatively, as illustrated in FIG. 11B, perforated or slotted plate 118A may be provided, with planar nozzle system 118B provided. As illustrated, planar nozzle system 118B may consist of two inclined planes coupled to form a slotted or planar nozzle. Again, as will be appreciated, such a planar nozzle assembly will have internal shapes and an exit orifice or orifices in order to distribute the cryogenic cleaning medium in a desired manner, etc.

Figure 9:
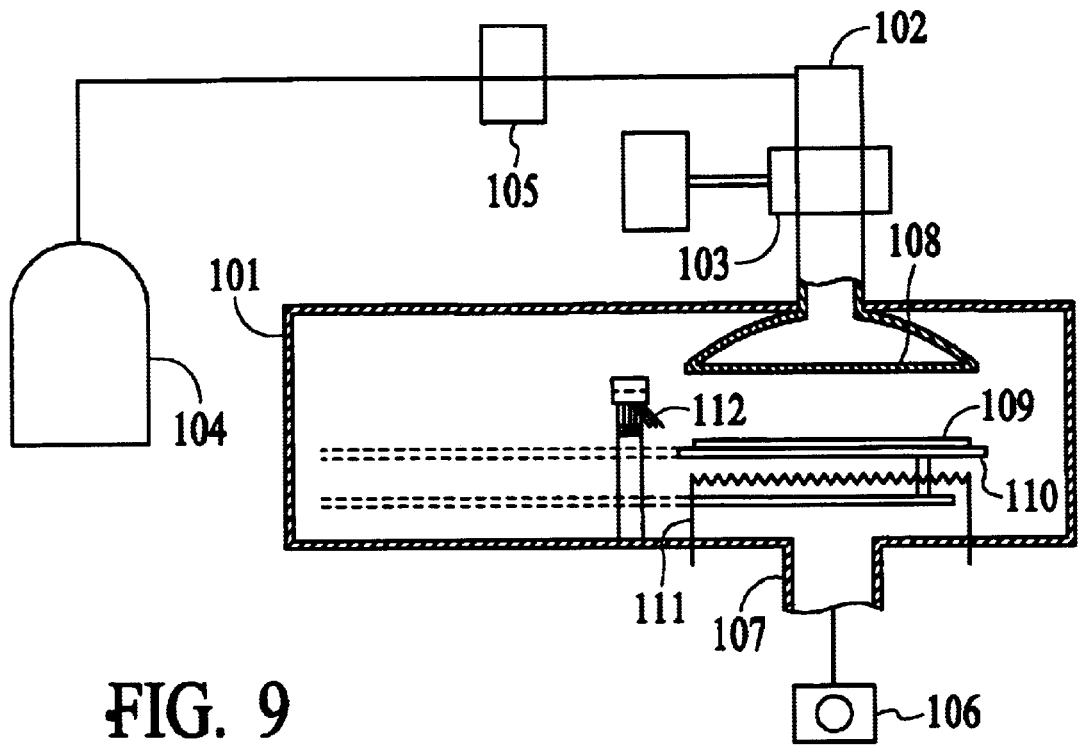
FIG. 9 illustrates an assembly for providing remotely generated plasma and/or an RF-generated plasma, with a preferably cryogenic cleaning assembly provided separate therefrom, with the article transported in order to be cryogenically cleaned.

FIG. 9 illustrates an alternative embodiment in which nozzle/nozzle assembly 112 is stationary, and wafer 109 moves relative to nozzle/nozzle assembly 112. In such an embodiment, wafer holder 110 consists of, or is on, a movement mechanism such as a linear slide assembly such that after plasma processing, wafer 109 is moved relative to nozzle/nozzle assembly 112 such that the cryogenic cleaning medium is presented to the surface of wafer 109 such as has been previously described. Also as previously described, the cryogenic cleaning medium may be delivered in an oscillatory or vibratory manner (although this is not required in all embodiments), which may be via a mechanism such described in connection with FIGS. 8A and 8B, or which may be via the oscillatory mechanisms as described in the Referenced Applications (and described above). Other aspects of the embodiment of FIG. 9 that are in common with the embodiments of FIGS. 8A and 8B, including the use of an RF source to generate an RF/RIE type plasma treatment, which will not be further described for purposes of convenience.

Figure 10:
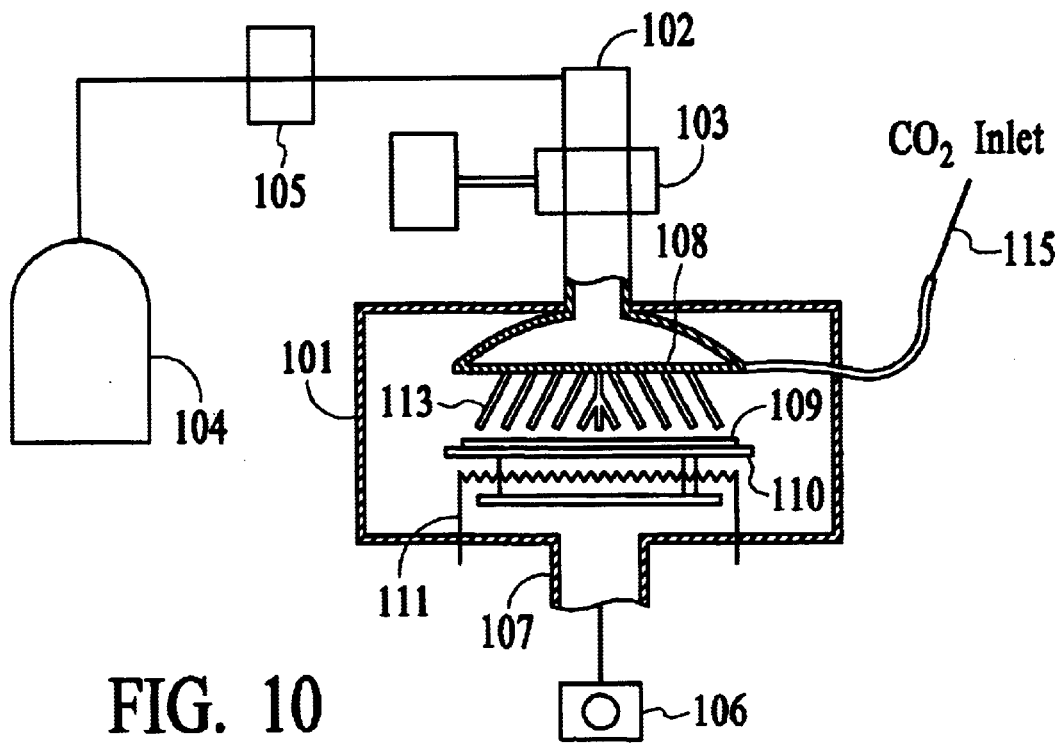
FIG. 10 illustrates an assembly for providing remotely generated plasma and/or an RF-generated plasma, with a preferably cryogenic cleaning assembly utilizing a common showerhead-type electrode.
Figure 12:
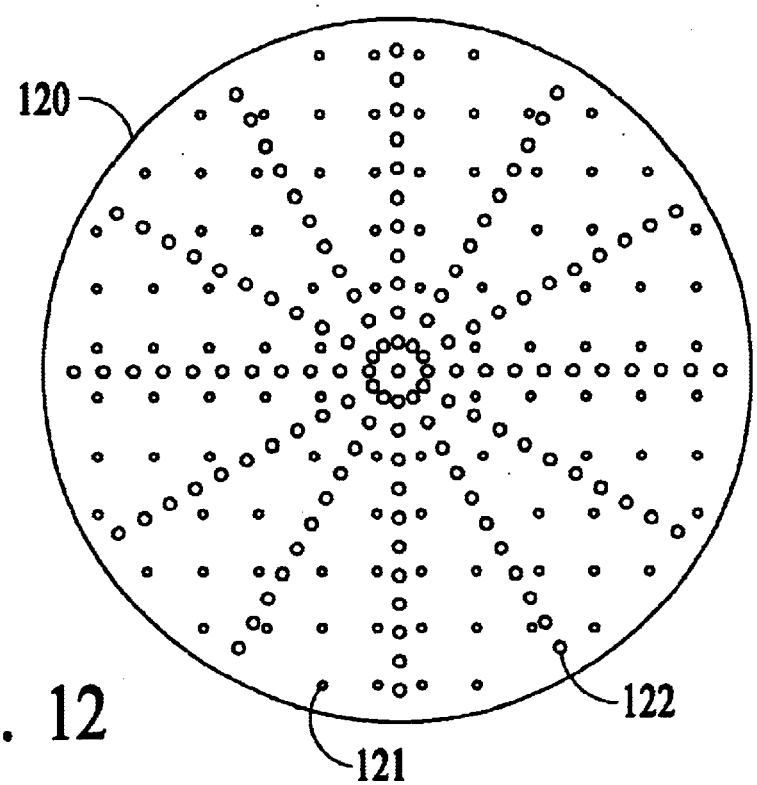
FIG. 12 illustrates a showerhead-type gas distribution implement utilized in certain preferred embodiments.

FIG. 10 illustrates a further alternative embodiment, wherein showerhead 108 includes inlet 115 for purposes of introducing the cryogenic cleaning medium (e.g., carbon dioxide). In such embodiments, showerhead 108 provides for delivery of free radicals generated from the reactant gas to the surface of wafer 109, while also providing for delivery of the cryogenic cleaning medium to the surface of wafer 109. In an illustrative operation of such an embodiment, a plasma/free radical treatment may be provided (which may be accompanied or substituted by an RF/RIE plasma treatment, such as previously described), which may involve showerhead 108 distributing free radicals generated from the reactant gas at a first point in time (plasma treatment phase), and distributing the cryogenic cleaning medium at a second point in time (cryogenic cleaning phase) (the distribution of free radicals and/or cryogenic cleaning medium is illustrated in FIG. 10 by spray pattern 113). In certain embodiments, a single set of distribution holes are provided in showerhead 108, with the reactant gas flow and the cryogenic cleaning medium flow alternatively turned on and off. As illustrated in FIG. 12, however, showerhead 120 may be provided, which includes separate distribution holes for the plasma/free radicals (holes 122) and cryogenic cleaning nozzles (holes 121). In such embodiments, holes 122 have a size and shape for the more optimum delivery of plasma/free radicals, while holes 121 have a size and shape for the more optimum delivery of the cryogenic cleaning medium. In one exemplary embodiment, the size of holes 122 is greater than the size of holes 121, and preferably hole 121 are formed to provide a nozzle effect for the dispersal and distribution of the cryogenic cleaning medium, etc. As the characteristics of the medium passing through the holes, and the more optimum delivery conditions from the holes, are quite distinct, having first and second holes of differing sizes and shapes and flow characteristics has been determined to provide more optimum results in such embodiments.

Figure 13:
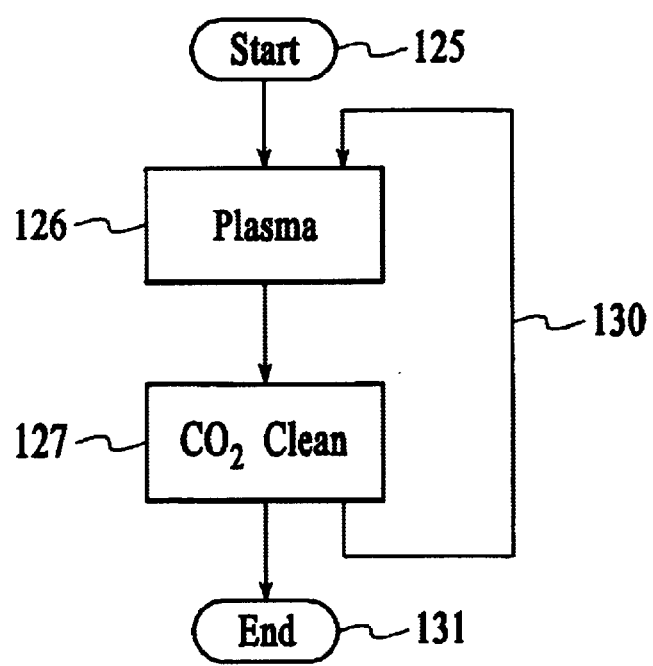
FIG. 13 is a simplified flow diagram illustrating certain preferred process flows in accordance with certain embodiments of the present invention.

FIG. 13 illustrates a general process flow in accordance with preferred embodiments of the present invention. As previously described, an article, wafer, substrate, etc. having a layer to be removed (e.g., a photoresist-type layer) is introduced into the processing chamber. This generally is illustrated by start step 125. At step 126, a plasma treatment step is provided, such as previously described. This may consist of plasma/free radicals remotely generated such as previously described, and/or an RF or RIE type plasma treatment, also such as previously described. At step 127, a cryogenic cleaning (e.g., carbon dioxide) process is performed, such as previously described. This may be a two step, two phase process, where a single plasma phase/step 126 is performed, and then a single cryogenic cleaning phase/step 127 is performed, with the flow then stopping as illustrated by end step 131. In alternate embodiments, however, as indicated by flow path 130, a plasma treatment phase/step is provided followed by a cryogenic cleaning phase/step, with the plasma treatment-cryogenic cleaning steps repeated a plurality of times. In such embodiments, and without being bound by theory, it is believed that the plasma treatment phase provides a primarily chemical means for removal of the target material, while the cryogenic cleaning phase removes residues and materials present after the plasma treatment phase, and with a subsequent plasma treatment phase helping remove residue and materials present after the cryogenic cleaning phase. While not illustrated in FIG. 13, in certain such embodiments, the process begins and ends with a plasma treatment phase.

Although the invention has been described in conjunction with specific preferred and other embodiments, it is evident that many substitutions, alternatives and variations will be apparent to those skilled in the art in light of the foregoing description. Accordingly, the invention is intended to embrace all of the alternatives and variations that fall within the spirit and scope of the appended claims. For example, it should be understood that, in accordance with the various alternative embodiments described herein, various systems, and uses and methods based on such systems, may be obtained. The various refinements and alternative and additional features also described may be combined to provide additional advantageous combinations and the like in accordance with the present invention. Also as will be understood by those skilled in the art based on the foregoing description, various aspects of the preferred embodiments may be used in various subcombinations to achieve at least certain of the benefits and attributes described herein, and such subcombinations also are within the scope of the present invention. All such refinements, enhancements and further uses of the present invention are within the scope of the present invention.

What is claimed is:

1. A method for manufacturing an article, the article having a resist layer to be removed during the manufacture of the article, comprising the steps of:

generating free radicals from one or more reactant gases remote from a processing chamber containing the article;

introducing the free radicals into the processing chamber, wherein the free radicals react with the resist layer; and supplying a cryogenic cleaning medium into the processing chamber, wherein the cryogenic cleaning medium removes residue present after the free radicals react with the resist layer;

wherein the reactant gases are selected to result in residue from the reaction with the resist layer having weakened bonds, wherein the residue is removed with the cryogenic cleaning medium;

wherein the resist layer is removed from the article.

2. The method of claim 1, further comprising the steps of:

applying RF energy to one or more electrodes in the processing chamber;

generating an RF plasma, wherein the RF plasma is generated from the reactant gases and/or from the free radicals, wherein the RF plasma reacts with resist layer;

wherein the step of supplying a cryogenic cleaning medium operates to remove residue present after the RF plasma reacts with the resist layer.

3. The method of claim 1, wherein one or more of the introducing and supplying steps are repeated a plurality of times.

4. The method of claim 3, wherein at least one of the introducing steps is performed after a predetermined supplying step, wherein the free radicals react with residue present after the predetermined supplying step.

5. The method of claim 1, wherein the cryogenic cleaning medium is supplied in an oscillatory or vibratory manner.

6. A method for manufacturing an article, the article having a resist layer to be removed during the manufacture of the article, comprising the steps of:

applying RF energy to one or more electrodes in a processing chamber containing the article;

generating an RF plasma, wherein the RF plasma is generated based on one or more reactant gases, wherein the RF plasma reacts with the resist layer;

supplying a cryogenic cleaning medium into the processing chamber, wherein the cryogenic cleaning medium operates to remove residue present after the RF plasma reacts with the resist laser;

wherein the reactant gases are selected to result in residue from the reaction with the resist layer having weakened bonds, wherein the residue is removed with the cryogenic cleaning medium;

wherein the resist layer is removed from the article.

7. The method of claim 6, further comprising the steps of generating free radicals from the one or more reactant gases remote from the processing chamber;

introducing the free radicals into the processing chamber, wherein the free radicals react with the resist layer; and wherein the step of supplying a cryogenic cleaning medium operates to remove residue present after the free radicals react with the resist layer.

8. The method of claim 6, wherein one or more of the generating and supplying steps are repeated a plurality of times.

9. The method of claim 8, wherein at least one of the generating steps is performed after a predetermined supplying step, wherein the RF plasma react with residue present after the predetermined supplying step.

10. The method of claim 6, wherein the cryogenic cleaning medium is supplied in an oscillatory or vibratory manner.

11. The method of claim 1, wherein the reactant gases are selected to result in removal of the residue with the cryogenic cleaning medium.

12. The method of claim 1, wherein the reactant gases comprise gases selected from the group consisting of oxygen, nitrogen, hydrogen, fluorine, and hydrofluoro carbon.

13. The method of claim 12, wherein the reactant gases are selected to result in residue from the reaction with the resist layer having weekend bonds, wherein th residue is removed with the cryogenic cleaning medium.

14. The method of claim 12, wherein the reactant gases are selected to result in removal of the residue with the cryogenic cleaning medium.

15. The method of claim 1, wherein the reactant gases comprise gases selected from the group consisting of O2, N2, H2, CF4 and NF3.

16. The method of claim 15, wherein the reactant gases are selected to result in residue from the reaction with the resist layer having weekend bonds, wherein the residue is removed with the cryogenic cleaning medium.

17. The method of claim 15, wherein the reactant gases are selected to result in removal of the residue with the cryogenic cleaning medium.

18. The method of claim 6, wherein the reactant gases are selected to result in removal of the residue with the cryogenic cleaning medium.

19. The method of claim 6, wherein the reactant gases comprise gases selected from the group consisting of oxygen, nitrogen, hydrogen, fluorine, and hydrofluoro carbon.

20. The method of claim 19, wherein the reactant gases are selected to result in residue from the reaction with the resist layer having weekend bonds, wherein the residue is removed with the cryogenic cleaning medium.

21. The method of claim 19, wherein the reactant gases are selected to result in removal of the residue with the cryogenic cleaning medium.

22. The method of claim 6, wherein the reactant gases comprise selected from the group consisting of O2, N2, H2, CF4 and NF3.

23. The method of claim 22, wherein the reactant gases are selected to result in residue from the reaction with the resist layer having weekend bonds, wherein the residue is removed with the cryogenic cleaning medium.

24. The method of claim 22 wherein the reactant gases are selected to result in removal of the residue with the cryogenic cleaning medium.

* * * * *